US012584957B2

(12) United States Patent　　　　(10) Patent No.:　　US 12,584,957 B2

Lou et al.　　　　　　　　　　　　(45) Date of Patent:　　Mar. 24, 2026

(54) WAFER TESTING CASSETTE

(71) Applicant: XINGR TECHNOLOGIES (ZHEJIANG) LIMITED, Yiwu City (CN)

(72) Inventors: Choon Leong Lou, Singapore (SG); Ho Yeh Chen, Zhubei City (TW)

(73) Assignee: XINGR TECHNOLOGIES (ZHEJIANG) LIMITED, Yiwu City (CN)

( * ) Notice: Subject to any disclaimer, the term of this patent is extended or adjusted under 35 U.S.C. 154(b) by 126 days.

(21) Appl. No.: 18/622,063

(22) Filed: Mar. 29, 2024

(65) Prior Publication Data

US 2025/0093386 A1　　Mar. 20, 2025

(30) Foreign Application Priority Data

Sep. 15, 2023　(CN) .......................... 202311197186.X
Dec. 27, 2023　(CN) .......................... 202311826333.5

(51) Int. Cl.
　*G01R 31/28*　　(2006.01)
　*G01R 1/04*　　(2006.01)
　*G01R 1/073*　　(2006.01)
　*G01R 1/16*　　(2006.01)

(52) U.S. Cl.
　CPC ....... *G01R 31/2875* (2013.01); *G01R 1/0416* (2013.01); *G01R 1/07342* (2013.01); *G01R 1/16* (2013.01); *G01R 31/2831* (2013.01); *G01R 31/2862* (2013.01); *G01R 31/2863* (2013.01); *G01R 31/2868* (2013.01); *G01R 31/2891* (2013.01)

(58) Field of Classification Search
None
See application file for complete search history.

(56) References Cited

U.S. PATENT DOCUMENTS

2016/0187377 A1*　6/2016　Mccloud ............ G01R 1/06705
　　　　　　　　　　　　　　　　324/750.19

FOREIGN PATENT DOCUMENTS

| CN | 112782438 A | 5/2021 |
|---|---|---|
| JP | 1068758 A | 3/1998 |
| JP | 2003338529 A | 11/2003 |
| JP | 2004198186 A | 7/2004 |
| JP | 200693706 A | 4/2006 |

(Continued)

*Primary Examiner* — Farhana A Hoque
(74) *Attorney, Agent, or Firm* — Li & Cai Intellectual Property (USA) Office

(57)　　　　　　　ABSTRACT

A wafer testing cassette is provided. The wafer testing cassette includes a first housing, a second housing and a magnetic force generating assembly. The first housing include a probe card, the probe card includes at least one probe having a paramagnetic property. The second housing is combined with the first housing and has a magnetic force generating assembly arranged corresponding to the at least one probe. A wafer located in the second housing, and the at least one probe electrically contacts at least one pad of the wafer with a predetermined contact force. When the magnetic force generating assembly is configured to generate a first magnetic attraction force, the magnetic force generating assembly attracts the at least one probe, so that the at least one probe electrically contacts the at least one pad with a first contact force which is greater than or equal to the predetermined contact force.

10 Claims, 6 Drawing Sheets

(56)                    References Cited

FOREIGN PATENT DOCUMENTS

| JP | 20217149 | A | 1/2021 |
| JP | 202134399 | A | 3/2021 |
| KR | 1020120104405 | A | 9/2012 |
| KR | 101805446 | B1 | 12/2017 |
| KR | 1020220061545 | A | 5/2022 |
| KR | 102456347 | B1 | 10/2022 |

* cited by examiner

WAFER TESTING CASSETTE

CROSS-REFERENCE TO RELATED PATENT APPLICATION

This application claims the benefit of priority to patent application No. 202311197186.X, filed on Sep. 15, 2023 in People's Republic of China, and patent application No. 202311826333.5, filed on Dec. 27, 2023 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wafer testing cassette, and more particularly to a wafer testing cassette including a magnetic structure for adjusting the needle pressure of a probe on a device under test.

BACKGROUND OF THE DISCLOSURE

When a wafer is completed for an integrated circuit design, the wafer is required to go through burn-in test and electrical test. Conventionally, wafers are burned in and tested for reliability by passing each wafer through a test rig and a probe card. Each wafer is placed on a carrier and electrically contacted by the probe of the probe card to complete the test. Therefore, the more wafers the more test stands and probe cards are required, resulting in greater time and equipment costs for the testing process.

In the current technology, in order to increase the efficiency of the burn-in test, a composite test cell system has been developed to perform burn-in test on several wafers at the same time. The mentioned system has multiple test cell arrays in a test terminal, each wafer is configured in each test cell array, and each test cell has at least one chuck to hold the wafer, which is connected to the wafer via a tester for burn-in test or electrical test.

On the other hand, a wafer testing cassette has recently been developed, in which the probe card and wafers are pre-positioned and placed inside the wafer testing cassette, and the wafer testing cassette is directly and electrically connected to the testing machine, so that the wafer testing cassette can be placed in the test cell for burn-in or electrical testing. Existing wafer testing cassettes have a combination of upper and lower housings, which require alignment for the probe card and wafers.

Furthermore, due to process tolerances and the weight of the wafer, the finished wafer is not a completely flat surface, and thus the pads on the wafer are not on a flat level, which increases the chances of inaccurate results due to uneven or insufficient contact between the probe and the pads in the pre-positioned process.

In addition, the existing wafer testing cassettes are pre-positioned by means of probe cards and wafers, and the probe needle pressure is fixed. There is no way to adjust the needle pressure for different testing needs.

Accordingly, how to overcome the above defects through structural design improvement has become one of the important issues to be solved in this industry.

SUMMARY OF THE DISCLOSURE

In response to the above-referenced technical inadequacies, the present disclosure provides a wafer testing cassette, which comprises a first housing, a second housing and a magnetic force generating assembly. The first housing includes a probe card, the probe card includes at least one probe having paramagnetic property. The second housing is configured to be combined with the first housing and has a magnetic force generating assembly arranged corresponding to the at least one probe. A wafer located in the second housing, the at least one probe electrically contacts at least one pad of the wafer with a predetermined contact force. When the magnetic force generating a first magnetic attraction force, the magnetic force generating assembly attracts the at least one probe, so that the at least one probe electrically contacts the at least one pad with a first contact force which is greater than or equal to the predetermined contact force.

In one of the possible or preferred embodiments, the first contact force is greater than the predetermined contact force. The at least one probe resumes electrical contact with the at least one pad at the predetermined contact force when the magnetic force generating assembly disengages the first magnetic attraction force.

In one of the possible or preferred embodiments, the magnetic force generating assembly is further configured to generate a second magnetic attraction force, so that the at least one probe electrically contacts the at least one pad with the second contact force, the second contact force is greater than the first contact force.

In one of the possible or preferred embodiments, the magnetic force generating assembly is connected to a control circuit, and the control circuit controls the magnetic force generating assembly to generate the first magnetic attraction force.

In one of the possible or preferred embodiments, the control circuit is disposed in the wafer testing cassette.

In one of the possible or preferred embodiments, the control circuit controls the magnetic force generating assembly to interrupt the magnetic attraction force after the at least one probe executes a test process.

In one of the possible or preferred embodiments, the magnetic force generating assembly is a non-permanent magnet.

In one of the possible or preferred embodiments, the first housing includes a first magnetic component, the second housing includes a second magnetic component, the second magnetic component is arranged corresponding to the first magnetic component, and the first housing and the second housing are tightly combined with each other through a magnetic attraction generated between the first magnetic member and the second magnetic member. In a state in which no magnetic attraction is generated, the at least one probe electrically contacts the at least one pad with a third contact force. In a state in which the magnetic attraction is generated, the magnetic attraction drives the at least one probe to electrically contact the at least one pad of the wafer at a fourth contact force. The predetermined contact force is equal to the sum of the third contact force and the fourth contact force.

In one of the possible or preferred embodiments, the first housing has a first snap fastener, the second housing has a second snap fastener, the second snap fastener is arranged corresponding to the first snap fastener, and the first housing and the second housing are tightly combined with each other through a snap force generated between the first snap fastener and the second snap fastener. In a state in which no snap force is generated, the at least one probe electrically contacts the at least one pad with a fifth contact force. In a state in which the snap force is generated, the snap force drives the at least one probe to electrically contact the at least one pad of the wafer at a sixth contact force. The predetermined contact force is equal to the sum of the fifth contact force and the sixth contact force.

In one of the possible or preferred embodiments, the first housing and the second housing are tightly combined with each other through vacuuming. In a state without vacuuming, the at least one probe electrically contacts the at least one pad with a seventh contact force. In a state with vacuuming, the at least one probe electrically contacts the at least one pad with an eighth contact force. The predetermined contact force is equal to the sum of the seventh contact force and the eighth contact force.

Therefore, one of the beneficial effects of the present disclosure is that, in the wafer testing cassette provided by the present disclosure, by virtue of the magnetic attraction force, the probe can apply different needle pressures to different wafers. Further, by virtue of the magnetic attraction force, the electrical contact between the probe and wafer can be stabilized to prevent the alignment between the probe and wafer from being affected when the wafer testing cassette is subjected to external forces (e.g., shaking), such as the occurrence of shifting, which would be detrimental to the test process.

For a better understanding of the features and technology of the present disclosure, please refer to the following detailed description and drawings of the disclosure, however, the drawings are provided for reference and illustration only and are not intended to limit the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
FIG. 1 is a schematic view of a wafer testing cassette according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiments

Figure 2:
FIG. 2 is another schematic view of the embodiment shown in FIG. 1.

Referring to FIGS. 1 and 2, FIGS. 1 and 2 are schematic views of a wafer testing cassette 1A of a first embodiment of the present disclosure. The wafer testing cassette 1A includes a first housing 11, a second housing 12 and a wafer 13. The first housing 11 includes a probe card 112, the probe card 112 includes at least one probe 1121 having a paramagnetic property. According to some embodiments, the probe 1121 is for example made of metallic nickel. The second housing 12 is combined with the first housing 11, and the second housing 12 includes a magnetic force generating assembly MG1 arranged corresponding to the at least one probe 1121. The wafer 13 is located in the second housing 12. When the first housing 11 is combined with the second housing 12, the at least one probe 1121 electrically contacts at least one pad 131 of the wafer 13 with a predetermined contact force P1. The magnetic force generating assembly MG1 attracts the at least one probe 1121 when generating a first magnetic attraction force M1, so that the at least one probe 1121 electrically contacts the at least one pad 131 with a first contact force F1 which is greater than or equal to the predetermined contact force P1.

In one embodiment, the first magnetic attraction force M1 causes the probe 1121 to more securely electrically contact the pads 131 of the wafer 13 along a direction toward the second housing 12 without increasing the predetermined contact force P1 of the probe 1121 to the pads 131 of the wafer 13.

In one embodiment, an unevenness in the wafer 13 or a tolerance problem in the pads 131 that causes the probes 1121 to be insufficient to make good electrical contact against the predetermined contact force P1 of the pads 131 of the wafer 13, and the first magnetic attraction force M1 attracts the probes 1121 so that the probe 1121 faces the direction toward the second housing 12, providing a first contact force F1 that is greater than the predetermined contact force P1 so that each probe 1121 have sufficient contact force to electrically contact the pads 131 of the wafer 13. In this embodiment, when the magnetic force generating assembly MG1 disengages the first magnetic attraction force M1, for example, when the test process is completed by the probes 1121, the probes 1121 resumes electrical contact with the pads 131 at the predetermined contact force P1.

As shown in FIGS. 1 and 2, the magnetic force generating assembly MG1 is a non-permanent magnet, e.g., an electromagnet, which is connected to a switch S and a power source P. The magnetic force generating assembly MG1 generates a first magnetic attraction force M1 or disengages a first magnetic attraction force M1 by turning the switch S on and off. However, the present disclosure is not limited thereto.

Figure 3:
FIG. 3 is a schematic view of a use status of a wafer testing cassette according to a second embodiment of the present disclosure shown in FIG. 1.
Figure 4:
FIG. 4 is another schematic view of a use status of the embodiment shown in FIG. 3.

Referring to FIGS. 3 and 4, FIGS. 3 and 4 are schematic views of a use status of a wafer testing cassette 1B of a second embodiment of the present disclosure. According to the embodiment, the wafer testing cassette 1B further includes a shielding member 2, the magnetic force generating assembly MG1 is a permanent magnet, and the shielding member 2 is configured to shield the magnetic force generating assembly MG1 for blocking the first magnetic attraction force M1 between the magnetic force generating assembly MG1 and the probe 1121. At this time, the probe 1121 electrically contacts the pads 131 of the wafer 13 at the predetermined contact force P1. When the probe 1121 is required to execute the test process, the shielding member 2 is moved away from the position of the shielding magnetic force generating assembly MG1, so that the magnetic force generating assembly MG1 generates a first magnetic attraction force M1 on the probe 1121, and the probe 1121 is attracted to electrically contact the pad 131 with a first contact force F1 to execute the test process. After the test process is completed by the probe 1121, the shielding member 2 returns to an original shielding position (as shown in FIG. 3) to interrupt the first magnetic attraction force M1. At this time, the probe 1121 resumes electrical contact with the pad 131 at the predetermined contact force P1. According to some embodiments, notwithstanding that the shielding member 2 is in the shielding position that shields the magnetic force generating assembly MG1, there is still a third magnetic attraction force of the magnetic force generating assembly on the probe 1121 (the drawings do not show that the third magnetic attraction force is smaller than the first magnetic attraction force M1). At this time, the predetermined contact force P1 includes the third magnetic attraction force and the force generated when the first housing 11 and the second housing 12 is combined with each other.

Figure 5:
FIG. 5 is a schematic view of a wafer testing cassette according to a third embodiment of the present disclosure.

Referring to FIG. 5, FIG. 5 is a schematic view of the wafer testing cassette 1C of a third embodiment of the present disclosure. In this embodiment, the magnetic force generating assembly MG1 further generates a second magnetic attraction force M2, so that the probe 1121 electrically contacts the pad 131 with the second contact force F2. The second contact force F2 is greater than the first contact force F1. For example, the magnetic force generating assembly MG1 is connected to a control circuit CRT, which can activate and deactivate the magnetic force generating assembly MG1 to generate a magnetic force and can control the magnitude of the magnetic force (e.g., to generate a first magnetic attraction force M1 or a second magnetic attraction force M2), e.g., the control circuit CRT adjusts the current or power of the power supply P by means of a control signal, which affects the magnetic attraction of the magnetic generator MG1 as the first magnetic attraction force M1 or the second magnetic attraction force M2. In this way, different needle pressures can be applied to wafer 13 (pad 131) for different wafer 13 testing needs, and also, the needle pressure can be adjusted to meet wafer or chip tolerances, so that each probe contacts the pad actually. After the test process is executed by the probe, the control circuit CRT controls the magnetic force generating assembly MG1 to interrupt the magnetic attraction force (the first magnetic attraction force M1 or the second magnetic attraction force M2), so that the contact force P1 between the probe 1121 and the wafer 13 is resumed to the predetermined contact force P1. For example, the control circuit CRT stops the power supply P from outputting current by means of a control signal, or the control circuit CRT controls the switch S to be in the activated state, both of which control the magnetic force generating assembly MG1 to interrupt the magnetic attraction force.

According to some embodiments, unlike the embodiment shown in FIG. 5, the control circuit CRT may further be disposed within the wafer testing cassette 1C. The present disclosure do not limit thereto.

Referring again to FIGS. 1 and 3, in the embodiment shown in FIGS. 1 and 3, the first housing 11 includes a first magnetic member 111 and the second housing 12 includes a second magnetic member 121. The second magnetic member 121 is arranged corresponding to the first magnetic member 111. The first housing 11 and the second housing 12 are tightly combined with each other through the magnetic attraction MF generated between the first magnetic member 111 and the second magnetic member 121. In a state in which the magnetic attraction MF has not yet been generated (e.g., when a magnetic shielding member 14 moves to a position shielding the second magnetic member 121), the probe and the pad 131 are in electrical contact with a third contact force. In a state in which the magnetic attraction is generated between the first housing 11 and the second housing 12 (e.g., where the magnetic shielding member 14 moves away from the position shielding the second magnetic member 121), the magnetic attraction MF drives an additional fourth contact force for electrically contact between the probe and the pad 131. The predetermined contact force P1 is equal to the sum of the third contact force and the fourth contact force. That is, the third contact force and the additional fourth contact force generated by the combining process between the first housing 11 and the second housing 12 are equivalent to the predetermined needle pressure of the probe 1121 on the wafer 13, and do not cause the probe 1121 to destroy or damage the wafer 13. In other words, in the state in which the magnetic attraction is generated, the magnetic attraction force MF drives the at least one probe 1211 to electrically contact the at least one pad 131 of the wafer 13 at the predetermined contact force P1.

Figure 6:
FIG. 6 is a schematic view of a wafer testing cassette according to a fourth embodiment of the present disclosure.

Referring to FIG. 6, FIG. 6 is a schematic view of the wafer testing cassette 1D of a fourth embodiment of the present disclosure. In addition to the above mentioned tightly combination of the first housing 11 and the second housing 12 by magnetic attraction, according to the embodiment shown in FIG. 6, the first housing 11 includes a first snap fastener 115 and the second housing 12 includes a second snap fastener 116, the second snap fastener 116 is arranged corresponding to the first snap fastener 115. The first housing 11 and the second housing 12 are tightly combined with each other through the snap force of the first snap fastener 115 and the second snap fastener 116. In a state in which no snap force is generated (i.e., when the first housing 11 and the second housing 12 are not yet tightly combined with each other), the probe electrically contacts the pad 131 with a fifth contact force. In the state in which a snap force is generated (when the first housing 11 and the second housing 12 are tightly combined with each other), the snap force provides an additional sixth contact force for electrical contact between the probe and the pad 131. The predetermined contact force P1 is equal to the sum of the fifth contact force and the sixth contact force. That is, the fifth contact force and the additional sixth contact force generated by the combining process between the first housing 11 and the second housing 12 are equivalent to the predetermined needle pressure (predetermined contact force P1) of the probe 1121 on the wafer 13, and do not cause the probe 1121 to destroy or damage the wafer 13. In other words, in the state in which the snap force is generated, the snap force drives the at least one probe 1211 to electrically contact the at least one pad 131 of the wafer 13 at the predetermined contact force P1.

In some further embodiments, the first housing 11 and the second housing 12 are tightly combined with each other through vacuuming. In a state without vacuuming, the at least one probe 1211 electrically contacts the at least one pad 131 with a seventh contact force. In a state with vacuuming, an additional eighth contact force is provided for the electrical contact between the at least one probe 1211 and the at least one pad 131. The predetermined contact force P1 is equal to the sum of the seventh contact force and the eighth contact force. That is, the seventh contact force and the additional eighth contact force generated by the combining process between the first housing 11 and the second housing 12 through vacuuming are equivalent to the predetermined needle pressure (predetermined contact force P1) of the probe 1121 on the wafer 13, and do not cause the probe 1121 to destroy or damage the wafer 13. In other words, in the state with vacuuming, the at least one probe 1211 electrically contact the at least one pad 131 of the wafer 13 at the predetermined contact force P1.

Beneficial Effects of the Embodiments

In conclusion, one of the beneficial effects of the present disclosure is that, in the wafer testing cassette provided by the present disclosure, by virtue of the magnetic attraction force, the probe can apply different needle pressures to different wafers. Further, by virtue of the magnetic attraction force, the electrical contact between the probe and wafer can be stabilized to prevent the alignment between the probe and wafer from being affected when the wafer testing cassette is subjected to external forces (e.g., shaking), such as the occurrence of shifting, which would be detrimental to the test process.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer testing cassette, comprising:
   a first housing including a probe card, the probe card including at least one probe having a paramagnetic property;
   a second housing configured to be combined with the first housing;

a magnetic force generating assembly disposed in the second housing and arranged corresponding to the at least one probe;
   a wafer located in the second housing, the at least one probe electrically contacting at least one pad of the wafer with a predetermined contact force within an enclosed space formed by a combination of the first housing and the second housing,
   wherein, when the magnetic force generating assembly is configured to generate a first magnetic attraction force, the magnetic force generating assembly attracts the at least one probe, so that the at least one probe electrically contacts the at least one pad with a first contact force which is greater than or equal to the predetermined contact force.

2. The wafer testing cassette according to claim 1, wherein the first contact force is greater than the predetermined contact force, wherein the at least one probe resumes electrical contact with the at least one pad at the predetermined contact force when the magnetic force generating assembly disengages the first magnetic attraction force.

3. The wafer testing cassette according to claim 1, wherein the magnetic force generating assembly is further configured to generate a second magnetic attraction force, so that the at least one probe electrically contacts the at least one pad with the second contact force; wherein the second contact force is greater than the first contact force.

4. The wafer testing cassette according to claim 1, wherein the magnetic force generating assembly is a non-permanent magnet.

5. The wafer testing cassette according to claim 4, wherein the magnetic force generating assembly is connected to a control circuit, and the control circuit controls the magnetic force generating assembly to generate the first magnetic attraction force.

6. The wafer testing cassette according to claim 5, wherein the control circuit is disposed in the wafer testing cassette.

7. The wafer testing cassette according to claim 5, wherein the control circuit controls the magnetic force generating assembly to interrupt the first magnetic attraction force after the at least one probe executes a test process.

8. The wafer testing cassette according to claim 1, wherein the first housing includes a first magnetic component, the second housing includes a second magnetic component, the second magnetic component is arranged corresponding to the first magnetic component, and the first housing and the second housing are tightly combined with each other through magnetic attraction generated between the first magnetic member and the second magnetic member,
   wherein in a state in which the magnetic attraction is generated, the magnetic attraction drives the at least one probe to electrically contact the at least one pad of the wafer at the predetermined contact force.

9. The wafer testing cassette according to claim 1, wherein the first housing includes a first snap fastener, the second housing has a second snap fastener, the second snap fastener is arranged corresponding to the first snap fastener, and the first housing and the second housing are tightly combined with each other through a snap force generated between the first snap fastener and the second snap fastener,
   wherein in a state in which the snap force is generated, the snap force drives the at least one probe to electrically contact the at least one pad of the wafer at the predetermined contact force.

10. The wafer testing cassette according to claim 1, wherein the first housing and the second housing are tightly combined with each other through vacuuming, wherein in a state with vacuuming, the at least one probe electrically contact the at least one pad of the wafer at the predetermined contact force.

\* \* \* \* \*